US010126558B2

(12) United States Patent
Liu et al.

(10) Patent No.: US 10,126,558 B2
(45) Date of Patent: Nov. 13, 2018

(54) STABLE, NARROW SPECTRAL LINEWIDTH, FIBER-DELIVERED LASER SOURCE FOR SPIN EXCHANGE OPTICAL PUMPING

(71) Applicant: UT-Battelle, LLC, Oak Ridge, TN (US)

(72) Inventors: Bo Liu, Oak Ridge, TN (US); Xin Tong, Knoxville, TN (US); Chenyang Jiang, Knoxville, TN (US); Lee Robertson, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 96 days.

(21) Appl. No.: 14/992,649

(22) Filed: Jan. 11, 2016

(65) Prior Publication Data

US 2017/0199389 A1    Jul. 13, 2017

(51) Int. Cl.
*H01S 5/00* (2006.01)
*G02B 27/09* (2006.01)
(Continued)

(52) U.S. Cl.
CPC ....... *G02B 27/0944* (2013.01); *G02B 6/4204* (2013.01); *G02B 6/4215* (2013.01);
(Continued)

(58) Field of Classification Search
CPC ............ G02B 27/0944; G02B 6/29311; G02B 6/2706; G02B 6/32; G02B 27/0961; G01R 33/282; H01S 5/4081; H01S 5/0078

See application file for complete search history.

(56) References Cited

U.S. PATENT DOCUMENTS

| | | | |
|---|---|---|---|
| 2002/0107439 A1* | 8/2002 | Hersman | G01R 33/282 600/410 |
| 2009/0251697 A1* | 10/2009 | Cutillas | H01S 5/02248 356/400 |
| 2011/0216417 A1* | 9/2011 | Chann | G02B 27/0905 359/618 |

OTHER PUBLICATIONS

Jiang et al., "Polarized $^3$He Neutron Spin Filters at Oak Ridge National Laboratory," *Physics Procedia*, vol. 42, pp. 191-199 (2013).
Lancor et al., "Breakdown of Angular Momentum Selection Rules in High Pressure Optical Pumping Experiments," *Physical Review Letters*, vol. PRL 105, pp. 083003-1 to 083003-4 (Aug. 2010).
Laser Operations LLC, "QPC Lasers—BrightLock® Ultra-500," 2 pages (document not dated).
Liu et al., "Development of stable, narrow spectral line-width, fiber delivered laser source for spin exchange optical pumping," *Applied Optics*, vol. 54, No. 17, pp. 5420-5424 (Jun. 2015).

(Continued)

*Primary Examiner* — Xinning Niu
(74) *Attorney, Agent, or Firm* — Klarquist Sparkman, LLP

(57) ABSTRACT

Disclosed herein are example embodiments for providing high power, narrow linewidth, high-stability laser sources. Particular embodiments are adapted for use in spin exchange optical pumping (SEOP). One example system comprises an array of laser diodes; a beam twister positioned to receive individual beamlets from the array of laser diodes, the beam twister being configured to rotate the individual beamlets from the array of laser diodes and produce rotated beamlets; one or more collimating lenses positioned to receive the rotated beamlets produced by the beam twister and produce substantially collimated beamlets having a divergence angle; a spectral-line-width-reducing element positioned to receive the substantially collimated beamlets from the one or more collimating lenses and produce spectral-line-width-reduced beamlets; an optical fiber; and one or more focusing lenses positioned between the optical fiber and the spectral-line-width-reducing element and configured to receive the spectral-line-width-reduced beamlets and focus them into the optical fiber.

30 Claims, 14 Drawing Sheets

(51) Int. Cl.
  *G02B 6/42*   (2006.01)
  *G02B 6/32*   (2006.01)
  *G02B 6/27*   (2006.01)
  *G02B 6/293*  (2006.01)
  *G01R 33/28*  (2006.01)
  *H01S 5/022*  (2006.01)
  *H01S 5/40*   (2006.01)

(52) U.S. Cl.
  CPC ....... *G02B 6/4296* (2013.01); *G02B 27/0961* (2013.01); *H01S 5/0078* (2013.01); *G01R 33/282* (2013.01); *G02B 6/2706* (2013.01); *G02B 6/29311* (2013.01); *G02B 6/32* (2013.01); *H01S 5/02284* (2013.01); *H01S 5/4012* (2013.01)

(56) References Cited

OTHER PUBLICATIONS

Liu et al., "Spectral Linewidth narrowing and tunable two-color laser operation of two diode laser arrays," *Applied Optics*, vol. 51, No. 11, pp. 1816-1821 (Apr. 2012).

Tong et al., "In situ polarized $^3$He system for the Magnetism Reflectometer at the Spallation Neutron Source," *Review of Scientific Instruments*, vol. 83, pp. 075101-1 to 075101-6 (Jul. 2012).

Walter et al., "Energy Transport in High-Density Spin-Exchange Optical Pumping Cells," *Physical Review Letters*, vol. 86, No. 15, pp. 3264-3267 (Apr. 2001).

* cited by examiner

STABLE, NARROW SPECTRAL LINEWIDTH, FIBER-DELIVERED LASER SOURCE FOR SPIN EXCHANGE OPTICAL PUMPING

ACKNOWLEDGEMENT OF GOVERNMENT SUPPORT

This invention was made with government support under Contract No. DE-AC05-000R22725 awarded by the U.S. Department of Energy. The government has certain rights in the invention.

FIELD

This application relates to lasers and more specifically to a laser system for spin-exchange optical pumping (SEOP).

BACKGROUND

High power laser diodes have been developed for many applications, including solid-state laser pumping, fiber laser pumping, and material processing. The spectral bandwidth of high power diodes is typically spread over the range of 3-5 nm. A narrower emission spectrum in the range of 0.1-0.5 nm and a smaller wavelength tolerance, however, can be extremely beneficial for special applications, such as spin exchange optical pumping (SEOP). SEOP has various diverse applications, including applications in nuclear physics, atomic physics, laser cooling, medical resonance imaging, and neutron scattering.

One example application for such diode lasers is the optical pumping of alkali metal vapors, typically rubidium. Such optical pumping can be used to polarize various atoms, such as $^3$He or $^{129}$Xe atoms. For instance, using SEOP, unpaired rubidium electrons can be polarized by laser, and then the polarization of electron is transferred to $^3$He atoms via hyperfine interaction. The polarized $^3$He gas can be used, for instance, as a neutron spin filter (NSF) in polarized neutron scattering experiments.

In order for SEOP to be successful over relatively long time periods, however, high-power spectrally narrowed lasers with good stability are highly desirable. For example, in order to achieve high efficiency optical pumping, it is desirable for the spectral bandwidth of the high-power laser to match the pressure-broadened D1 absorption line of rubidium vapor. When the spectral bandwidth of a laser matches the pressure-broadened absorption line-width of rubidium vapor, even a small drift of the center wavelength (e.g., 10% of spectral line-width) will greatly reduce the efficiency of the laser. The long term stability of a line-width matched laser is therefore desirable for many SEOP applications, including neutron spin filters (NSFs). Additionally, it is desirable for a SEOP laser system to be easily integrated into an in situ SEOP system.

SUMMARY

Disclosed herein are representative embodiments of methods, apparatus, and systems for providing high-stability laser sources. Particular embodiments are adapted for use in SEOP. The disclosed methods, apparatus, and systems should not be construed as limiting in any way. Instead, the present disclosure is directed toward all novel and/or non-obvious features and aspects of the various disclosed embodiments, alone or in various combinations and sub-combinations with one another.

Certain example embodiments disclosed herein comprise a stable, narrow spectral linewidth, fiber-delivered laser source for SEOP. In one example implementation, an optimized external cavity equipped with a volume holographic grating (VHG) is used to narrow the spectral line-width of a 100 Watt high power diode laser and to stabilize the laser spectrum. The laser spectrum of this example implementation exhibited a high side mode suppression ratio (SMSR) of >30 dB and good long term stability (center wavelength drifting within ±0.002 nm during 220 hours operation). Further, certain example implementations included a laser delivered by a multi-mode fiber with power of about 70 Watts, a center wavelength 794.77 nm, and a spectral bandwidth of ~0.12 nm. This example laser implementation is ideal for SEOP of $^3$He because of its long-term spectrum stability and narrow spectral line-width which closely matches the pressure-broadened rubidium D1 absorption line-width. In addition, in $^3$He experiments performed with this example implementation, it was observed that the example implementation having the 70 Watt laser produced the same $^3$He polarization as a commercial 200 Watt, 0.3 nm spectral bandwidth laser when measured using the Electron Paramagnetic Resonance (EPR) method.

In certain embodiments, and in order to further increase the optical power and optical pumping efficiency, multiple arrays of laser diodes can be combined and delivered via one optical fiber. For instance, in one example system, two 70 Watt laser diode arrays are combined and the resulting beam delivered via one optical fiber. This laser system can be scaled to 140 Watt with a 0.13 nm spectral line-width. By doing so, the effective laser power within 0.1 nm (the pressure broaden rubidium D1 line) is 108 Watt, which would well exceed a 68 Watt effective power of a typical commercial laser (200 Watt, 0.3 nm spectral bandwidth laser). Embodiments of the multi-laser-diode-array system thus form a powerful tool well suited for use in a variety of applications, including high efficiency SEOP.

Some embodiments of a laser system for spin exchange optical pumping in accordance with the disclosed technology comprise a laser source comprising an array of laser diodes; a beam twister positioned to receive individual beamlets from the array of laser diodes, the beam twister being configured to rotate the individual beamlets from the array of laser diodes and produce rotated beamlets; one or more collimating lenses positioned to receive the rotated beamlets produced by the beam twister and produce substantially collimated beamlets having a divergence angle; a spectral-line-width-reducing element positioned to receive the substantially collimated beamlets from the one or more collimating lens and produce spectral-line-width-reduced beamlets; an optical fiber; and one or more focusing lenses positioned between the optical fiber and the spectral-line-width-reducing element and configured to receive the spectral-line-width-reduced beamlets and focus the spectral-line-width-reduced beamlets into the optical fiber.

In certain implementations of such embodiments, the spectral-line-width-reducing element has an acceptance angle, and a distance between the one or more collimating lenses and the beam twister is selected such that the acceptance angle of the spectral-line-width-reducing element satisfies a threshold ratio relative to a divergence angle of the substantially collimated beamlets. The threshold ratio can be, for example, 4:1 or less between a divergence angle of the substantially collimated beamlets and the acceptance angle of the spectral-line-width-reducing element, or a ratio of 2:1 or less between a divergence angle of the substantially collimated beamlets and the acceptance angle of the spectral-line-width-reducing element. In some implementations, the spectral-line-width-reducing element is a volume holographic grating (VHG) (alternatively referred to as a volume Bragg grating (VBG)). In certain configurations, no collimating lens is positioned after the spectral-line-width-reducing element along a beam path of the system. The beam twister can be configured to cause a slow axis of the individual beamlets from the array of laser diodes to rotate 90 degrees and become oriented along a fast axis of the array of laser diodes. Further, the one or more collimating lens can be cylindrical lenses configured to reduce the divergence of the slow axis of the rotated beams produced by the beam twister. The beam twister itself can be a system that includes a beam-twister collimating lens configured to collimate a fast axis of the individual beamlets prior to rotating the individual beamlets. In certain implementations, the one or more focusing lenses of the system comprise a slow-axis focusing lens and a fast-axis focusing lens. The system can additionally comprise a chamber housing an alkali metal vapor, the optical fiber being configured to deliver the spectral-line-width-reduced beam to the chamber. The alkali metal vapor can be, for example, rubidium. Further, the chamber housing the alkali metal vapor can be configured to polarize one of $^3$He or $^{129}$Xe.

In further embodiments of the disclosed technology, multiple separate arrays of laser diodes are present and result in increased power. For example, in certain implementations, the laser source is a first laser source, the array of laser diodes is a first array of laser diodes, the beam twister is a first beam twister, and the rotated beamlets are first rotated beamlets, and the laser system further comprises: a second laser source comprising a second array of laser diodes; a second beam twister positioned to receive individual beamlets from the second array of laser diodes, the beam twister being configured to rotate the individual beamlets from the second array of laser diodes and produce second rotated beamlets; a half-wave plate positioned to receive the second rotated beamlets and produce a polarization-shifted version of the second rotated beamlets; and a polarizing beam splitter positioned to receive the polarization-shifted version of the second rotated beamlets and the first rotated beamlets and produce a combined set of rotated beamlets that are directed at the one or more collimating lenses.

In some embodiments of the disclosed technology, a series of laser light beamlets is directed into an array of tilted cylindrical lenses that rotate the laser light beamlets and produce rotated laser light beamlets. The rotated laser light beamlets are directed into one or more collimating cylindrical lenses that refract the rotated laser light beamlets and produce laser light beamlets with a smaller divergence angle. The light beamlets from the one or more collimating cylindrical lenses are directed into a spectrum-narrowing element that narrows a spectrum of the laser light beamlets around a center wavelength and produces spectrum-narrowed laser light beamlets, the spectrum-narrowing element further having an acceptance face with a specified acceptance angle. The spectrum-narrowed laser light beamlets are coupled into an input of a fiber optic cable. An output of the fiber optic cable is directed into an optical pumping chamber comprising an optical pumping vapor and target polarization atoms. In particular implementations of such embodiments, the divergence angle of the laser light beamlets from the one or more cylindrical lenses matches or substantially matches the specified acceptance angle of the spectrum-narrowing element. To achieve this, the divergence angle of the laser light beamlets emanating from the one or more cylindrical lenses is adjusted until it has a ratio of 2:1 or less relative to the specified acceptance angle of the spectrum-narrowing element. The adjusting can be performed by altering a distance between the one or more cylindrical lenses and the array of tilted cylindrical lenses. In particular implementations, the divergence angle of the laser light beamlets emanating from the one or more cylindrical lenses is adjusted until sidebands in the spectrum-narrowed laser light beamlets emanating from the spectrum-narrowing element are eliminated or substantially eliminated. Additionally, the temperature of the spectrum-narrowing element can be adjusted until the center wavelength matches or substantially matches an absorption linewidth of the optical pumping vapor.

In further embodiments of the disclosed technology, feedback between a VHG (VBG) and a laser beam source (e.g., a laser diode array) is increased by altering a distance between a collimating lens (which can be part of an array of one or more additional collimating lenses) and a beam twister rotating beamlets from the laser beam source. In such embodiments, the collimating lens produces substantially collimated beams that are incident on an acceptance face of the VHG (VBG). The beamlets produced from the VHG (VBG) are focused into an optical fiber, and an output of the optical fiber is directed into an optical pumping chamber comprising an optical pumping vapor and target polarization atoms. In particular implementations, the VHG (VBG) is positioned after all collimating lenses. In some implementations, the distance between the collimating lens and the output of the beam twister results in a ratio of 4:1 or less between a divergence angle of the substantially collimated beamlets and an acceptance angle of the VHG (VBG). In other implementations, the distance between the collimating lens and the output of the beam twister results in a ratio of 2:1 or less between a divergence angle of the substantially collimated beamlets and an acceptance angle of the VHG (VBG). In some implementations, the beam twister is interposed between the collimating lens and the laser beam source. In such implementations, the collimating lens can focus rotated versions of a slow axis of beamlets produced from the laser beam source. The VHG (VBG) can be an off-the-shelf, non-custom VHG (VBG). Further, the VHG (VBG) can have a relatively small acceptance angle, such as 10 mrad or less, or 5 mrad or less. In some implementations, the optical pumping vapor is rubidium. Further, in certain implementations, the target polarization atoms are one of $^3$He or $^{129}$Xe.

The foregoing and other objects, features, and advantages of the invention will become more apparent from the following detailed description, which proceeds with reference to the accompanying figures.

DETAILED DESCRIPTION

I. General Considerations

Figure 1:
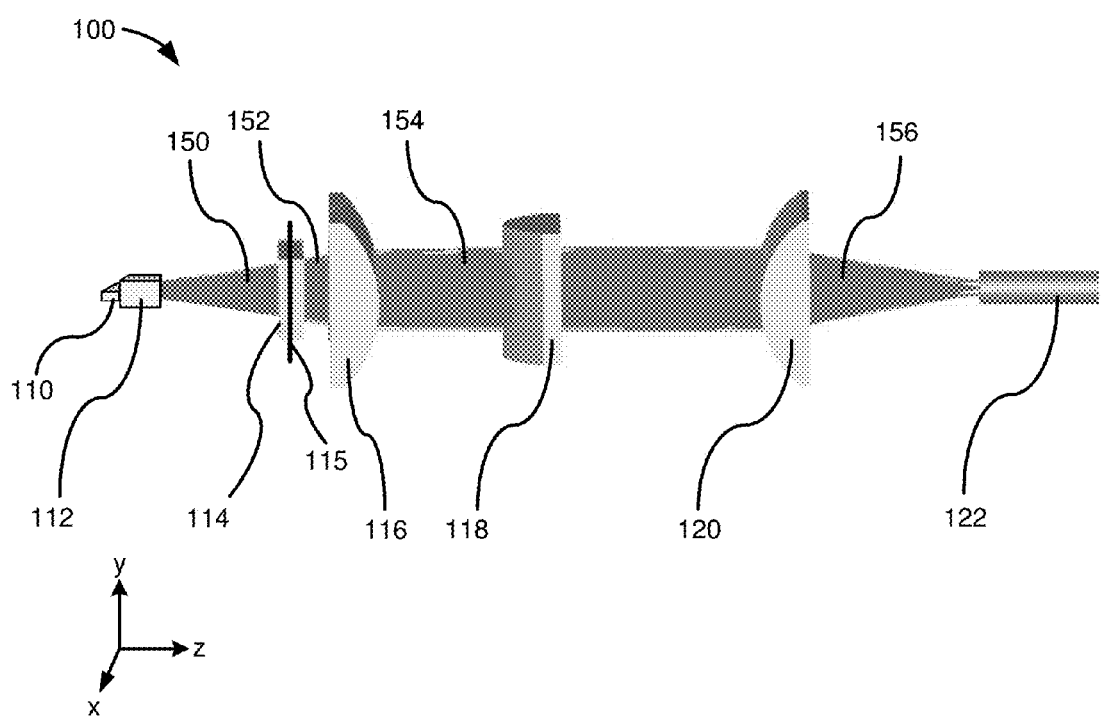
FIG. 1 is a schematic block diagram illustrating a first example laser system configured to produce a laser having a narrow spectral linewidth.

Disclosed herein are representative embodiments of methods, apparatus, and systems for providing high-stability laser sources. Particular embodiments are adapted for use in spin exchange optical pumping (SEOP). The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any feature or aspect of the disclosed embodiments can be used in various combinations and subcombinations with one another. For example, one or more method acts or features from one embodiment can be used with one or more method acts or features from another embodiment and vice versa. The disclosed methods, apparatus, and systems are not limited to any specific aspect or feature or combination thereof, nor do the disclosed embodiments require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods. Additionally, the description sometimes uses terms like "determine," "provide," and "optimize," to describe the disclosed methods. These terms are high-level abstractions of the actual operations that are performed. The actual operations that correspond to these terms may vary depending on the particular implementation and are readily discernible by one of ordinary skill in the art. Furthermore, in general, and as used herein, the term "optimal" describes a solution that satisfies some set of criteria better than other solutions according to some parameterization or modeling, which may or may not be optimal in absolute terms depending on circumstances, and the term "optimize" or "optimization" is used to indicate the process of finding such a solution. Additionally, as used herein, the term "and/or" means any one item or combination of any items in the phrase.

II. Overview of Disclosed Technology

The disclosed technology generally concerns highly stable laser sources. Particular applications for such laser sources include SEOP. Embodiments of the disclosed technology will be primarily described with reference to the spin exchange optical pumping of $^3$He, though it should be understood that the laser sources are adaptable for use in the polarization of other atoms, including $^{129}$Xe. Thus, when the discussion herein references $^3$He polarization, it is to be understood that this usage is by way of example only and that the technology can be applied in a variety of other applications, including $^{129}$Xe polarization or the polarization of other target atoms.

For SEOP of $^3$He, high power and spectrally narrowed diode lasers with a stable center wavelength are highly beneficial in achieving the polarization with fast polarization build-up. In this regard, the use of narrowband lasers offers several advantages over broadband lasers. For example, narrowband lasers use less laser power than broadband lasers to achieve the same effective laser power for optical pumping. Further, broadband lasers cannot fully polarize rubidium (Rb) atoms, thus limiting the achievable $^3$He polarization. Still further, high power broadband lasers (e.g., >100 Watt) can produce overheating in SEOP systems because most laser emission cannot be absorbed by Rb.

To fast polarize a large volume of $^3$He or other atom, a more powerful (e.g., >100 Watt) narrowband laser is desired. Embodiments of the disclosed technology provide such a laser source.

In certain example embodiments, a volume holographic grating (VHG) (also referred to as a volume Bragg grating (VBG)) is used to provide the external cavity feedback and narrow the spectral linewidth of the diode lasers (e.g., to 0.12 nm or less, or to 0.13 nm or less). Further, in certain embodiments, the resonant wavelength of the VHG (VBG) is aligned to the absorption of rubidium with fine temperature tuning.

The external cavity diode laser of one example implementation exhibits high efficiency (e.g., ~95% of total power), high spectrum purity (e.g., side-mode suppression ratio (SMSR) >30 dB), and good long term stability. For instance, one example implementation exhibits laser drifting of about ±0.002 nm for long periods of time (e.g., >100 hours, such as ~220 hour). While the power and optical fibers characteristics will vary from implementation to implementation, one example implementation comprises a laser source having 70 Watts of power delivered by a fiber with a core diameter of 800 μm and a numerical aperture NA=0.22. In addition, in a test to polarize $^3$He using this example implementation, the 70 Watt laser produced the same $^3$He polarization as a commercial 200 W, 0.3 nm spectral bandwidth laser, which was measured using the Electron Paramagnetic Resonance (EPR) method.

Higher laser powers can be achieved by combining laser modules (e.g., arrays of laser diodes) into one optical fiber.

For example, in one example implementation, two 70 Watt laser modules are combined into one optical fiber with a polarized beam combining design to reach ~140 W with a 0.13 nm spectral bandwidth.

Particular implementations disclosed herein include a fiber-delivered, stable (e.g., drifting <±0.01 nm), narrow spectral line-width (e.g., 0.13 nm or narrower), high power (e.g., 70 Watt or higher) diode laser system with the center wavelength at 794.77 nm for SEOP. In SEOP, rubidium atoms are first polarized through optical pumping and then the polarization is transferred to $^3$He nuclei via hyperfine interaction. These implementations are well-suited for SEOP $^3$He because of their long-term spectrum stability and narrow spectral line-width, which closely match the pressure-broadened rubidium D1 absorption line-width. In order to further increase the optical power and optical pumping efficiency, multiple lasers (e.g., multiple arrays of laser diodes) can be combined together (e.g., two or more 70 Watt lasers) and the resulting combined beam can be delivered with one optical fiber. Such multiple-laser-diode-array systems can be scaled to a desired power (e.g., the system can be scaled to 140 Watt with a 0.13 nm spectral line-width). By doing so, the effective laser power can be increased.

III. Detailed Description of Embodiments of the Disclosed Technology

In this section, example embodiments of high stability laser sources are disclosed. Particular embodiments are adapted for use in spin exchange optical pumping (SEOP) and exhibit one or more of the following characteristics: a center wavelength aligned to the rubidium D1 absorption line, a spectral bandwidth matched with the pressure-broadened rubidium D1 absorption line, long term stability (e.g., center wavelength drifting of less than ±0.02 nm over 100 hours or more), and/or a high power laser delivery using a single optical fiber.

FIG. 1 is a schematic block diagram illustrating a first example configuration 100 for narrowing the spectral line-width of a high power laser diode array. In the example configuration, a laser diode array (LDA) 110 produces an array of laser beamlets. The laser diode array can have a variety of configurations and number of diodes (e.g., a 1×n array), but in the illustrated embodiment is a linear array of 25 high power diodes (1×25 array). Further, in the illustrated embodiment, the linear array is oriented such that the laser diodes extend along a horizontal plane (e.g., the x-axis in FIG. 1) and produce beamlets with a slow axis along the horizontal plane and a fast axis along the vertical plane. The laser beamlet of each individual diode from the laser diode array 110 is rotated 90° by a beam twister 112. The beam twister 112 can comprise, for example, an array of 4520 tilted cylindrical lenses arranged to rotate the laser beamlets 90°. The beam twister 112 can also comprise a collimating lens positioned before the array of 4520 tilted cylindrical lenses and configured to collimate the fast axis of the beamlets emanating from the LDA 110. A volume holographic grating (VHG) (volume Bragg grating (VBG)) 114 is positioned directly after the beam twister 112 to narrow the laser spectral line-width of the rotated beamlets 150. A collimating lens 116 is positioned after the VHG (VBG) 114 and configured to collimate the rotated and spectral-line-width-narrowed beamlets 152. Further, although only one collimating lens 116 is shown, the configuration may comprise one or more additional collimating lenses. In the illustrated embodiment, the collimating lens 116 is oriented to collimate the slow axis (oriented vertically after rotation) of the beamlets emanating from the VHG (VBG) 114. A beam shaping lens pair (formed from first beam shaping lens 118 and second beam shaping lens 120, each configured to focus along a respective one of the fast and slow axes) can be added to produce a focused beam 156 and effectively couple the collimated laser beamlets 154 into a multi-mode fiber 122.

Figure 2:
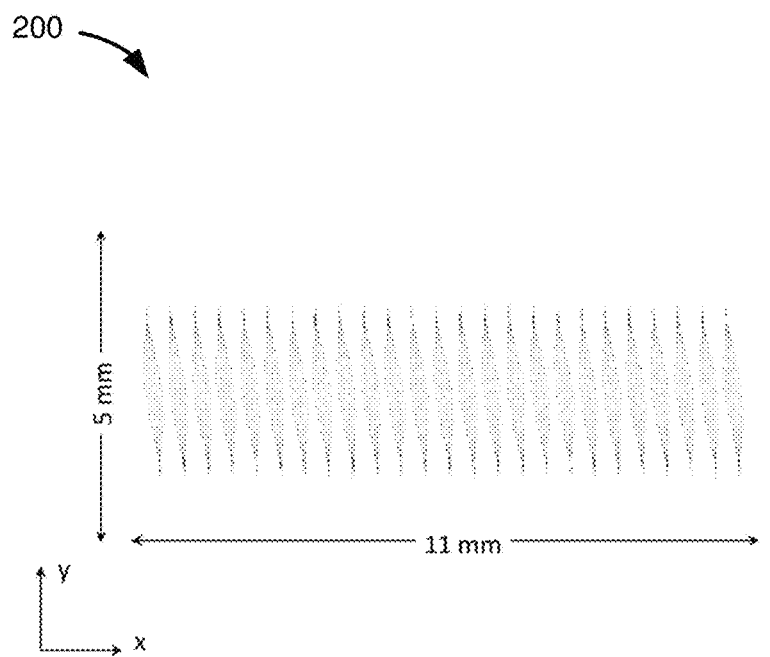
FIG. 2 is an image of the laser beamlets from the configuration of FIG. 1 on the surface of the VHG (VBG).

FIG. 2 is an image 200 of the laser beamlets on the surface of the VHG (VBG) 114 obtained through simulation. The image 200 illustrates the divergence of the beamlets on the surface of the VHG (VBG) 114. The divergence of the laser beamlets along the beam's slow axis (Y axis in FIG. 1) after the collimation lens 116 is ~120 mrads, as confirmed by the simulation.

Figure 3:
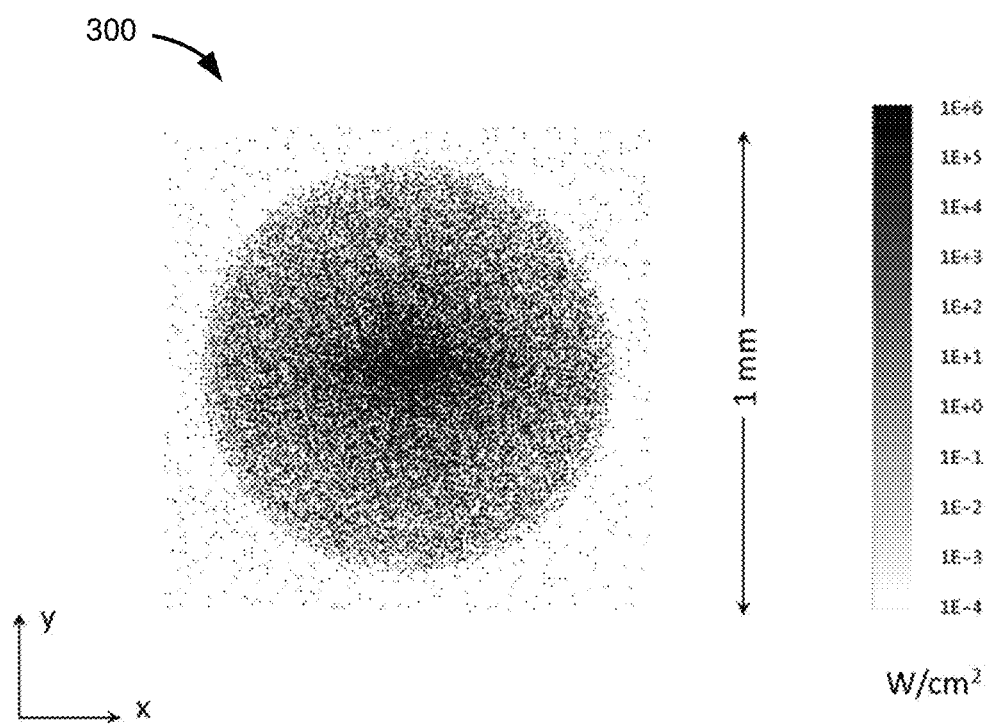
FIG. 3 is an image of the output of the optical fiber from an example implementation of the configuration of FIG. 1.

FIG. 3 is an image 300 of the output of the optical fiber with a core diameter of 800 μm and NA=0.22 obtained through simulation. The output efficiency was up to 82%.

Figure 4:
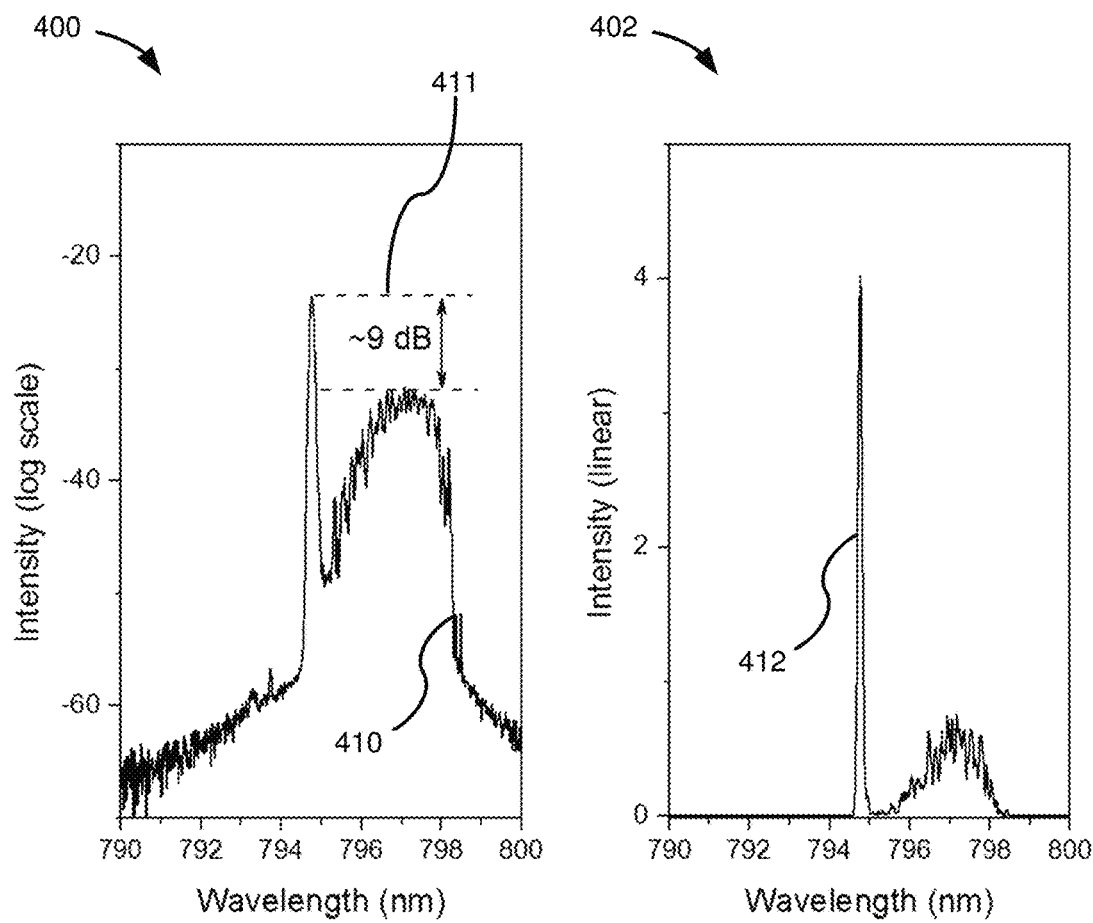
FIG. 4 is a set of graphs that illustrate the spectrum of the beam resulting from an example implementation of the configuration of FIG. 1.

FIG. 4 shows graphs 400, 402 that illustrate the spectrum of the configuration from FIG. 1 for a VHG (VBG) with a diffraction efficiency of 15% and bandwidth of ~0.12 nm. Graph 400 shows a plot 410 illustrating the spectrum of the laser beam resulting from the configuration of FIG. 1 along a logarithmic scale, whereas graph 402 shows a plot 412 illustrating the spectrum of the laser beam resulting from the configuration of FIG. 1 along a linear scale. As shown by graph 400, the SMSR of the spectrum is ~9 dB (illustrated by 411).

More specifically, the full-width at half-maximum (FWHM) of the laser spectral line-width was around 0.12 nm, the center wavelength of the laser was 794.77 nm when the temperature of the VHG (VBG) holder was tuned to 15°0 C., and the output power delivered by a 5-meter long 800 μm core NA 0.22 fiber was 72.2 Watts. Compared with the free running power 72.9 Watts, the optical efficiency of the laser system was ~99%. However, the SMSR is ~9 dB. The acceptance angle of the VHG (VBG) was small, around 5 mrads. The low SMSR, ~9 dB of the spectrum, is due to the acceptance angle of the VHG (VBG) that was not matched with the 120 mrads divergence angle of the laser beamlets along the fast-axis. As a result, only a small portion of 15% is fed back to lock the laser spectrum. Further, the feedback of the VHG (VBG) is not strong enough to suppress all side modes, especially because the center of gain profile is 2 nm away from the resonant center wavelength 794.77 nm.

In further embodiments of the disclosed technology, the SMSR is increased beyond that which is possible in the configuration of FIG. 1. In the embodiments discussed below, and primarily with reference to the configuration of FIG. 5, a significantly different configuration is implemented that allows the laser beamlets to be shaped and adapted for a particular VHG (VBG) in a manner not possible with the configuration of FIG. 1. Such embodiments allow for the use of a much wider variety of VHGs (VBGs) (e.g., in terms of availability, cost, etc). For example, the embodiments discussed below with respect to FIG. 5 allow for VHGs (VBGs) with small acceptance angles to be used, such as acceptance angles of 10 mrad or less or 5 mrad, and to nevertheless produce a high power beam for use in SEOP applications. Such small-acceptance angle VHGs (VBGs) are typical for "off-the-shelf" VHGs (VBGs). To obtain wider acceptance angles, custom VHGs (VBGs) must be manufactured, adding significant cost to a SEOP system.

Figure 5:
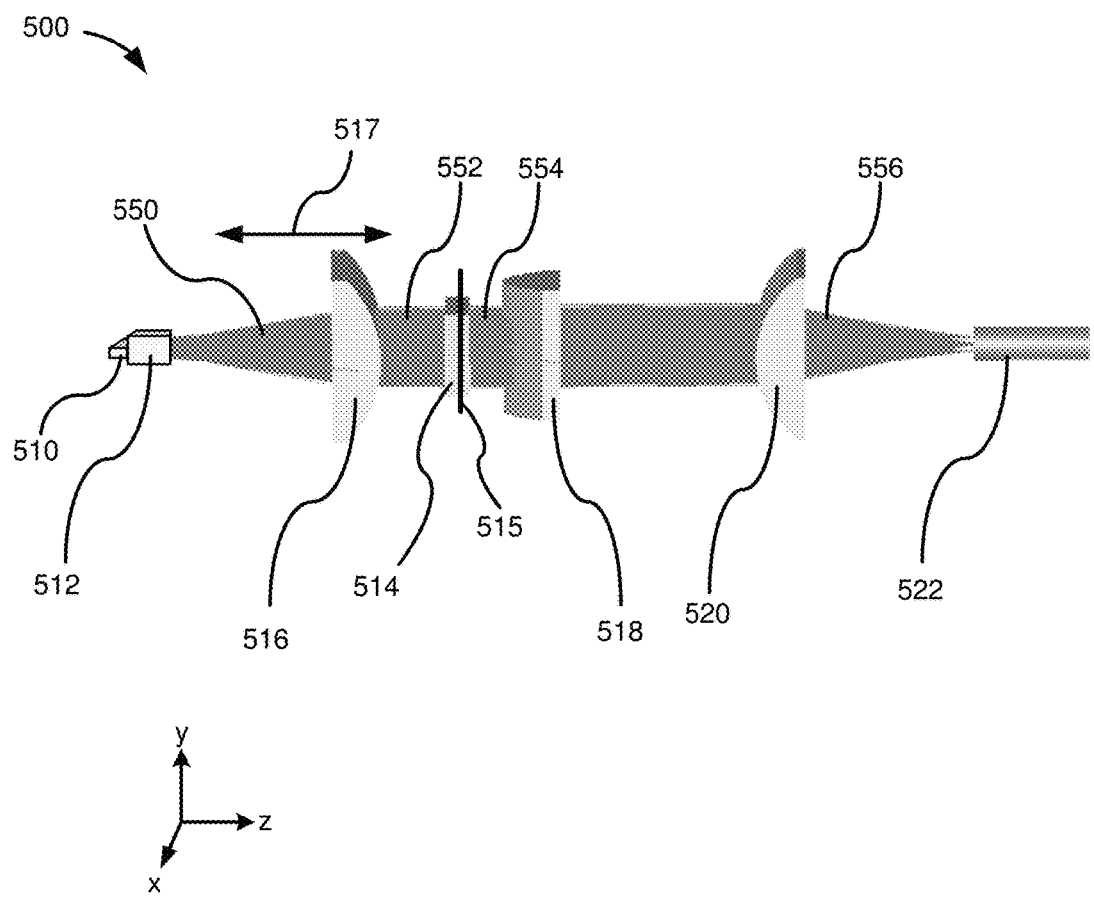
FIG. 5 is a schematic block diagram illustrating a second example laser source configured to produce a laser having a narrow spectral linewidth.

FIG. 5 is a schematic block diagram illustrating a second example configuration 500 for narrowing the spectral line-width of a high power laser diode array. The configuration of FIG. 5 provides various improvements over the configuration of FIG. 1, including improvement in one or more of SMSR, VHG (VBG) feedback performance, side-mode suppression, and/or stability.

In the example configuration shown in FIG. 5, a laser diode array 510 produces an array of laser beamlets. The laser diode array can have a variety of configurations and number of diodes (e.g., a 1×n array), but in the illustrated embodiment is a linear array of 25 high power diodes (1×25 array). Further, in the illustrated embodiment, the linear array is oriented such that the laser diodes extend along a horizontal plane (e.g., the x-axis in FIG. 5) and produce beamlets with a slow axis along the horizontal plane and a fast axis along the vertical plane. The laser beamlets of each individual diode from the laser diode array 510 is rotated 90° by a beam twister 512. The beam twister 512 can comprise, for example, an array of 45° tilted cylindrical lenses arranged to rotate the laser beamlets 90°. The beam twister 512 can also comprise a collimating lens positioned before the array of 45° tilted cylindrical lenses and configured to collimate the fast axis of the beamlets emanating from the LDA 510. A collimating lens 516 is positioned after the beam twister 512 and configured to collimate the rotated beamlets 550 and produce collimated beamlets 552. Further, although only one collimating lens 516 is shown, the configuration may comprise one or more additional collimating lenses. In the illustrated embodiment, the collimating lens 516 is oriented to collimate the slow axis (oriented vertically after rotation) of the beamlets emanating from the beam twister 512 and produce the collimated beamlets 552. In the configuration illustrated in FIG. 5, a VHG (VBG) 514 is positioned after the collimating lens 516 and produces spectral-line-width-reduced beamlets 554. A beam shaping lens pair (formed from first beam shaping lens 518 and second beam shaping lens 520, each configured to focus along a respective one of the fast and slow axes) can be added to produce a focused beam 556 to effectively couple the collimated, spectral-line-width-reduced laser beamlets 554 into a multi-mode fiber.

The configuration of FIG. 5 is based on the following considerations. The collimating lens 516 collimates the slow axis of the laser beamlets (along the fast axis of the laser diodes but along the slow axis after beam rotation) and reduces the divergence angle of the collimated laser beamlets along their slow axis (e.g., to 5 mrads or less) such that the divergence angle of the laser beamlets 552 from the collimating lens 516 matches or substantially matches the acceptance angle of the VHG (VBG). Notably, the slow axis of the beamlets has lesser beam quality and more modes than along the fast axis, and thus it is typically difficult or impossible to achieve a 0° divergence angle of the beamlets emanating from the collimating lens 516. In order to match or substantially match the divergence angle of the laser beamlets from the collimating lens 516 with the acceptance angle of the VHG (VBG), a distance between the collimating lens 516 and the output of the beam twister 512 can be adjusted such that the divergence angle of the beamlets produced by the collimation lens 516 satisfies a threshold ratio relative to an acceptance angle of the VHG (VBG) 518. This adjustment is illustrated in FIG. 5 by arrow 517. The threshold ratio can vary from implementation to implementation. In general, the threshold ratio is sufficient to increase the feedback between the VHG (VBG) 518 and the LDA 510 at the resonant wavelength of the VHG (VBG) such that the SMSR is 15 dB or greater and/or the side bands are substantially eliminated. The ratio can be, for example, 4:1 or smaller or 2:1 or smaller. With the ratio between the divergence angle from the collimation lens 516 being appropriately adjusted relative to the acceptance angle of the VHG (VBG) 518, the VHG (VBG) can provide an effective control of the laser diodes and narrow the spectrum of the beamlets well beyond that possible with the configuration of FIG. 1.

Figure 13:
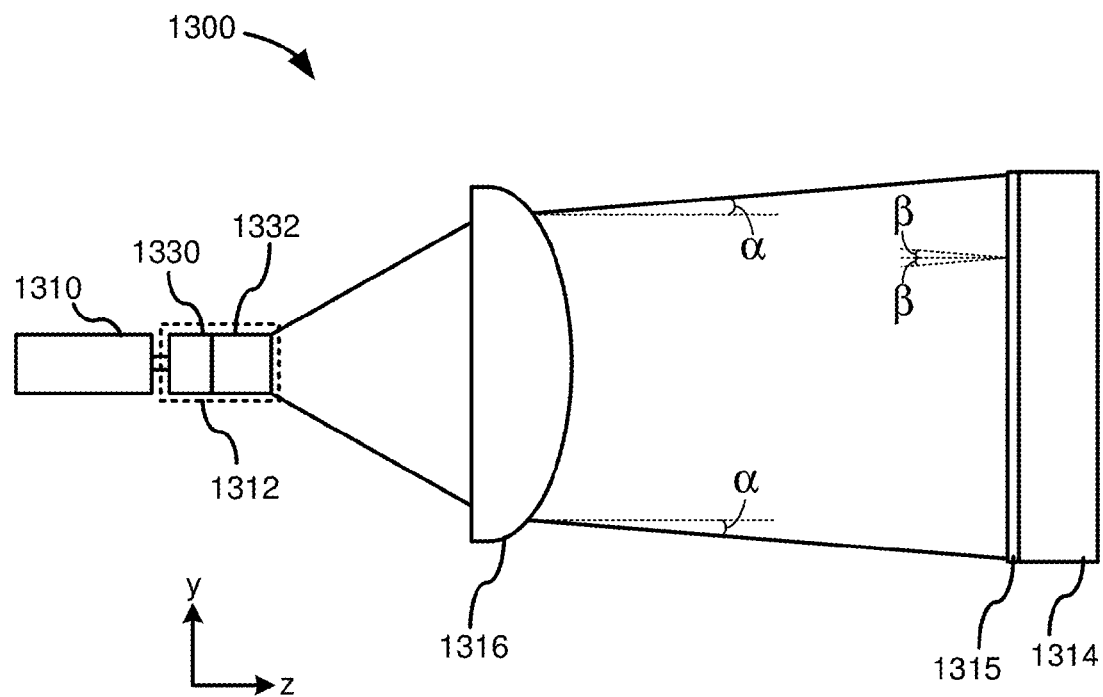
FIG. 13 is a schematic block diagram illustrating the relationship of the divergence angle of the beamlets emanating from the collimating lens and the acceptance angle of the VHG (VBG) in certain embodiments of the disclosed technology.

FIG. 13 is a schematic block diagram 1300 illustrating the relationship of the divergence angle of the beamlets emanating from a collimating lens 1316 as arranged relative to a beam twister 1312 (formed from a fast-axis collimating lens 1330 and array of 45° tilted cylindrical lenses 1332) and LDA 1310 as in the configuration illustrated in FIG. 5. The beamlets emanating from the collimating lens 1316 have a divergence angle $\alpha$. That beamlets are then incident on an acceptance face 1315 of the VHG (VBG) 1314. Also illustrated in FIG. 13 is the acceptance angle $\beta$ of the VHG (VBG) 1314. The acceptance angle $\beta$ is illustrated as an angle above and below a normal plane of the acceptance face 1315 of the VHG (VBG) 1314. Further, the acceptance angle $\beta$ is illustrated at an example grating of the VHG (VBG) 1314 but is representative of the acceptance angle across the face of the VHG (VBG) 1314. As noted, the distance between the collimating lens 1316 and the output of the beam twister 1312 can be adjusted to alter the divergence angle $\alpha$ and create a ratio between the divergence angle $\alpha$ and the acceptance angle $\beta$ of the VHG (VBG) 1314 that meets or satisfies a threshold value. For instance, increasing the distance between the collimating lens 1316 and the beam twister 1312 generally causes a reduction in the divergence angle $\alpha$, whereas decreasing the distance between the collimating lens 1316 and the beam twister 1312 generally causes an increase in the divergence angle $\alpha$. In particular embodiments, the ratio $\alpha:\beta$ between the divergence angle $\alpha$ and the acceptance angle $\beta$ is 4:1 or smaller, or 2:1 or smaller. Such ratios result in improved feedback between the VHG (VBG) 1314 and the LDA 1310 and increased SMSR, and thus provide improved power performance at the desired center wavelength.

Figure 6:
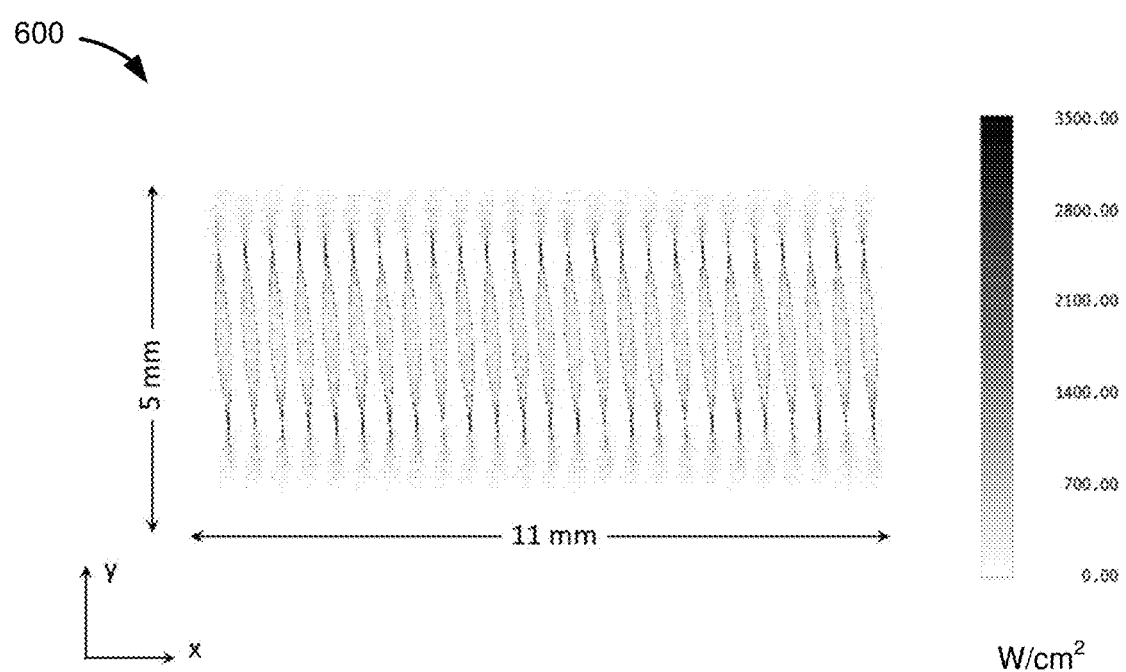
FIG. 6 is an image of the laser beamlets from the configuration of FIG. 5 on the surface of the VHG (VBG).

FIG. 6 is an image 600 of the laser beamlets on the surface of the VHG (VBG) 514 obtained through simulation. In the image 600, the divergence angle along the rotated (beam-twisted) slow axis (the fast axis of the LDA) was reduced to 5 mrad by the collimating lens 516. Notably, off-the-shelf, non-custom VHGs (VBGs) do not have a wide acceptance angle, and instead are typically 5 mrad or less. Accordingly, the laser beamlets generated by the collimating lens 516 are well suited for a wide variety of VHGs (VBSs), such as off-the-shelf VHGs (VBGs). Such flexibility in configurations of the disclosed technology allow for the SEOP laser source to be widely accessible without the need for any custom VHGs (VBGs).

Figure 7:
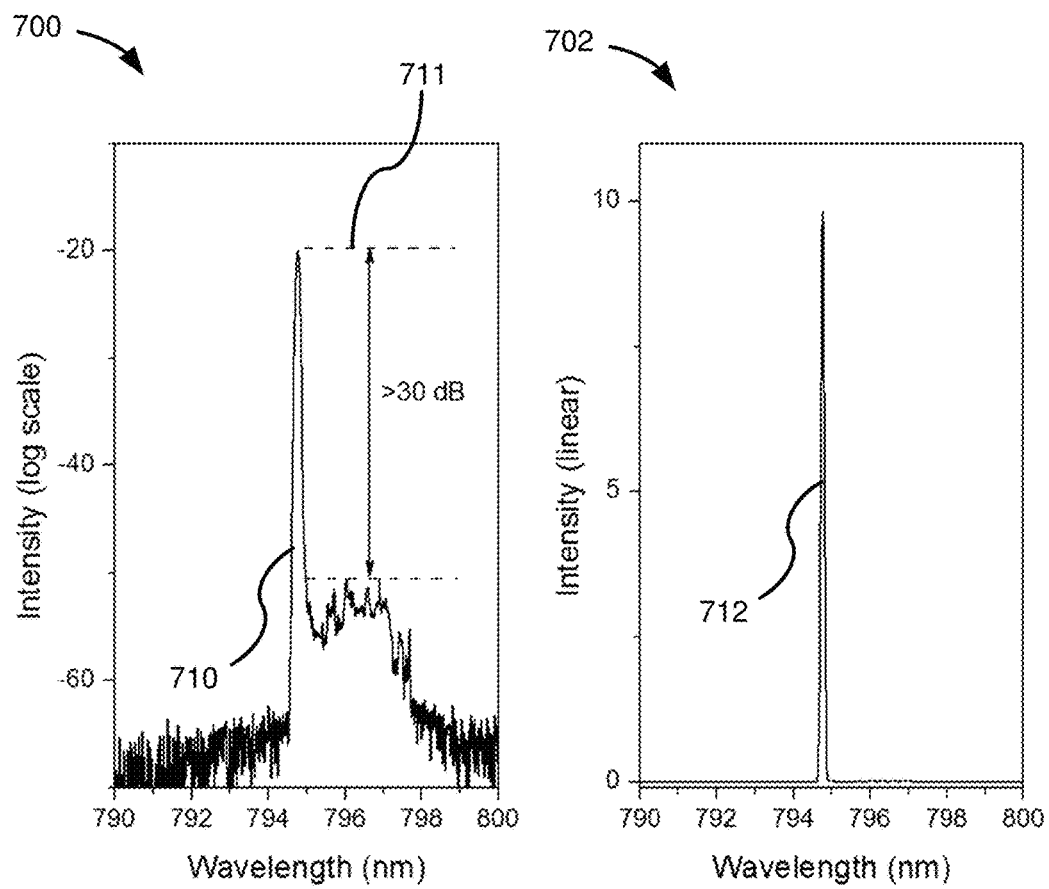
FIG. 7 is a set of graphs illustrating the spectrum of the beam resulting from an example implementation of the configuration of FIG. 5.

FIG. 7 shows graphs 700, 702 that illustrate the spectrum of the configuration from FIG. 5. Graph 700 shows a plot 710 of the spectrum of the laser beam resulting from the configuration of FIG. 5 along a logarithmic scale, whereas graph 702 shows a plot 712 of the spectrum of the laser beam resulting from the configuration of FIG. 5 along a linear scale.

As compared to the spectrums shown in FIG. 4, the SMSR was significantly increased from 9 dB to more than 30 dB (illustrated by 711). Further, as illustrated by graph 702, the side mode is invisible since the intensity ratio of the peak to the side mode was more than 1000. Additionally, the output power from the optical fiber is 70.0 Watts. Compared with the free running power of 72.9 Watts, more than 95% total power is located in the narrow bandwidth of 0.12 nm. Thus, the configuration of FIG. 5 can be effectively used to lock the center wavelength of the laser with a wide variety of VHGs (VBGs) (such as a non-customized, off-the-shelf VHG (VBG)).

In order to check the tunable range of the laser diode system, the temperature of the VHG holder was tuned from 10° C. to 40° C. The center wavelength was smoothly tuned from 794.714 nm at 10° C. to 794.940 nm at 40° C.

Figure 8:
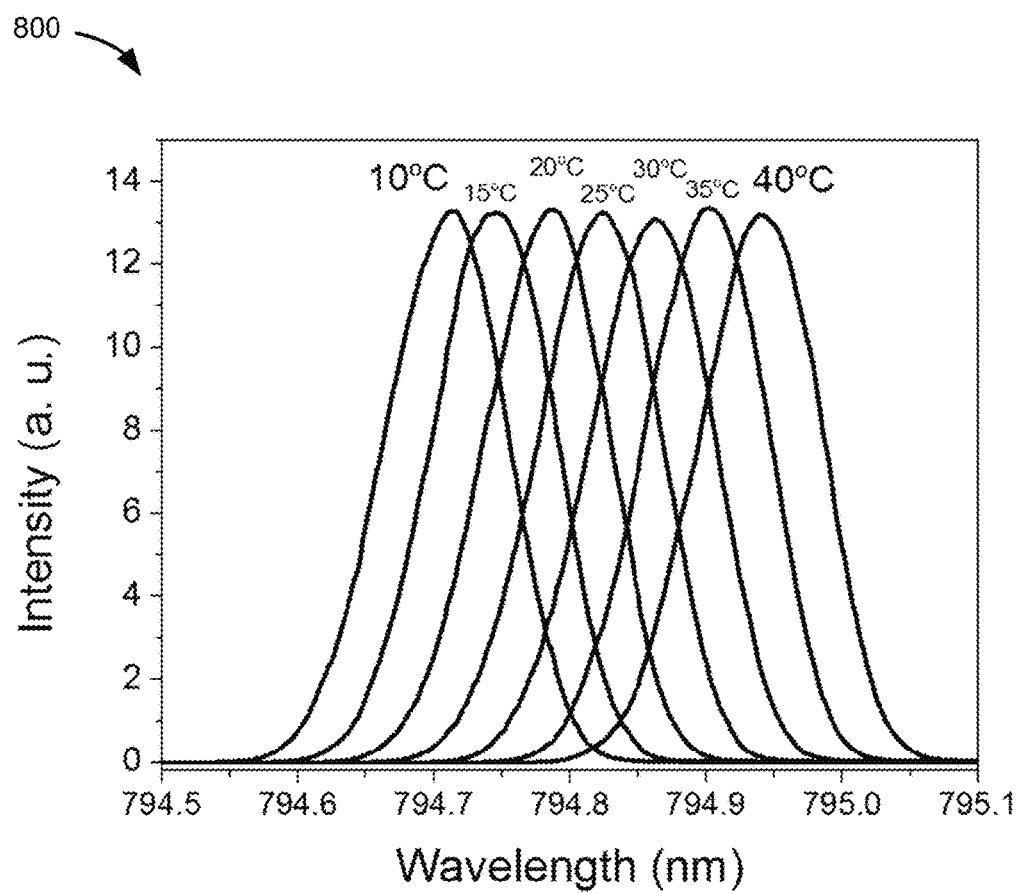
FIG. 8 is a graph showing how the center wavelength of the VHG (VBG) can be varied by temperature.

FIG. 8 is a graph 800 showing the center wavelength vs the temperature of the VHG holder for a variety of different temperatures. The average tuning rate is 0.0075 nm/K.

Figure 14:
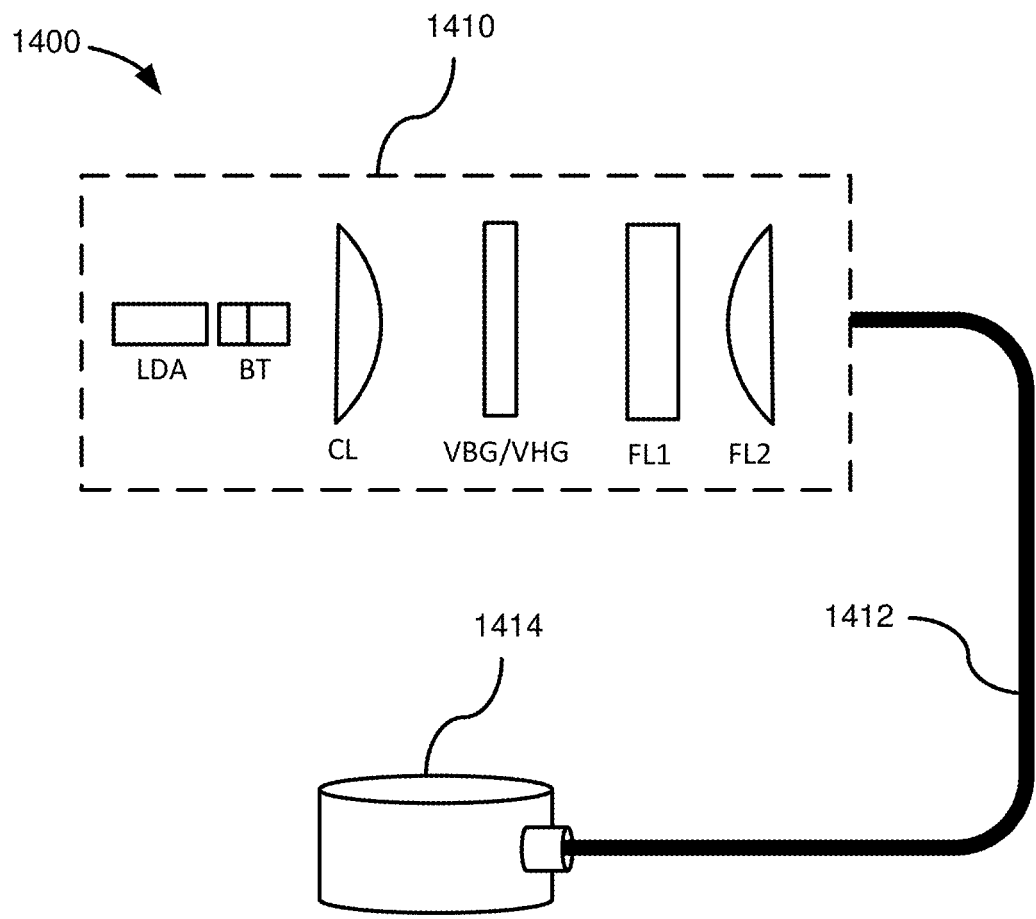
FIG. 14 is a schematic block diagram illustrating a SEOP system having a laser system with the configuration of FIG. 5.

As noted, embodiments of the disclosed laser source systems are adapted for use in a spin exchange optical pumping (SEOP) system. FIG. 14 is a schematic block diagram illustrating a SEOP system 1400 having a laser system 1410 having a configuration as in FIG. 5 and coupling the resulting laser beam into a fiber optic cable 1412. The fiber optic cable 1412 provides significant flexibility in how and/or to where the resulting beam is delivered. In the illustrated SEOP system, the fiber optic cable 1412 allows the laser system 1410 to provide a beam in a different beam path than the optical pumping chamber 1414. Further, in the illustrated embodiment, the optical pumping chamber 1414 is configured to house a vapor for optical pumping, such as an alkali metal vapor. The alkali metal vapor can be, for instance, rubidium. The optical pumping chamber 1414 typically further includes a target atom to be polarized by the vapor. For example, in particular implementation discussed herein, the target atom is $^{3}$He or $^{129}$Xe.

A variety of components and/or operational parameters can be used with embodiments of the disclosed technology. In example implementations of the configuration illustrated in FIG. 5 (and FIG. 1 as well), the following specific components and parameters were used, though such components and parameters can vary from implementation to implementation and should not be construed as limiting.

In particular example implementations of the configurations illustrated in FIG. 5 and FIG. 1, the laser diode array (LDA) comprises a 100 Watt, water-cooled, laser diode bar with the center wavelength around 797 nm. Such LDAs are available from, for example, LaserTel. In the particular example implementations, 25 laser diodes are present on one laser bar, though other numbers and configurations are also possible. In the particular implementations, the emitter size of each laser diode is 200 μm×1μm and the pitch of diodes is 400 μm. Further, each laser diode object has a spatial power distribution F(x, y) given by $F(x, y)=F(0,0)Exp(-2[(x/w_x)^{2H_x}+(y/w_y)^{2H_y}])$, where x and y are the horizontal and vertical position, respectively; $w_x$ (200 μm) and $w_y$ (1 μm) are the emitter size along the x, y direction, respectively; and $H_x$ (10) and $H_y$ (1) are the spatial-Gaussian factors, respectively. Further, in the particular example implementations, the beam twister is manufactured by Limo Optics. The beam twister of the particular example implementations comprises a beam-twister collimating lens (e.g., oriented along the fast axis of the LDA) and a 45° tilted cylindrical lenses array. Additionally, a plurality (e.g., two or three) cylindrical lenses shape the laser beamlets and couple them into a multi-mode fiber with a core diameter of 800 μm and with NA=0.22. Further, in the particular example implementations, the VHG (VBG) has a geometry of 15 mm×5 mm×1.5 mm. Such VHGs (VBGs) are available, for instance, from Ondax, Inc. In one example implementation having the configuration of FIG. 5, the VHG is located after the collimating lens and has a center wavelength of the VHG (VBG) is 794.7 nm, a spectral bandwidth of 0.12 nm, and a diffraction efficiency of 15%.

The VHG (VBG) can be held by a temperature controllable VHG (VBG) holder. For example, in the example implementation, the VHG (VBG) was held by a temperature controllable copper VHG (VBG) holder (illustrated schematically as VHG (VBG) holder 515 in FIG. 5 and VHG (VBG) holder 115 in FIG. 1). The temperature of the VHG (VBG) holder can be controlled by a temperature electronic (TE) controller (not shown). In the example implementation, a portion (e.g., 4%) of the output laser from the fiber was sampled by a beam sampler and focused on a diffuser with a 20° diffraction angle. The laser beam passing through the diffuser was refocused and coupled into a multi-mode fiber connected with an Optical Spectrum Analyzer (Agilent 86146B) with a spectral bandwidth 0.07 nm.

Figure 9:
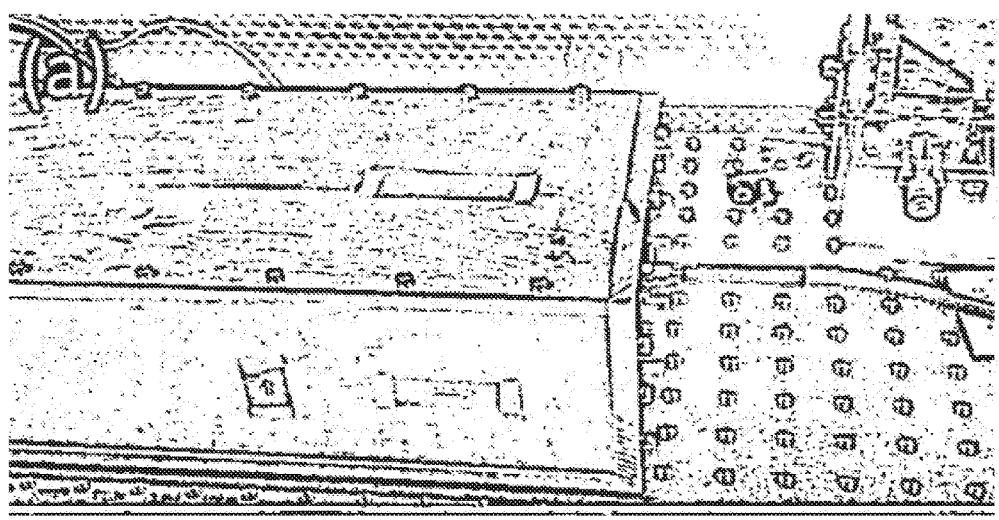
FIG. 9 is an image of an example implementation of the configuration shown in FIG. 5.

FIG. 9 is an image 900 of the example implementation of the configuration shown in FIG. 5. In particular, the image 900 shows an implementation of the FIG. 5 configuration packaged as a turnkey diode laser system.

Figure 10:
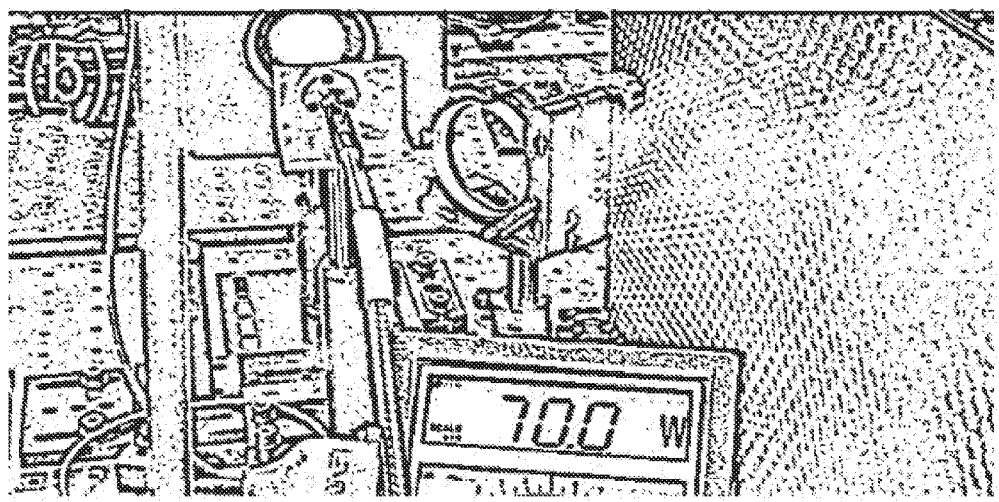
FIG. 10 another image of the example implementation of the configuration shown in FIG. 5.

FIG. 10 is an image 1000 of a measurement taken of the output power delivered by the example implementation. As can be seen in FIG. 10, the output power delivered by the fiber was measured to be 70 W.

Figure 11:
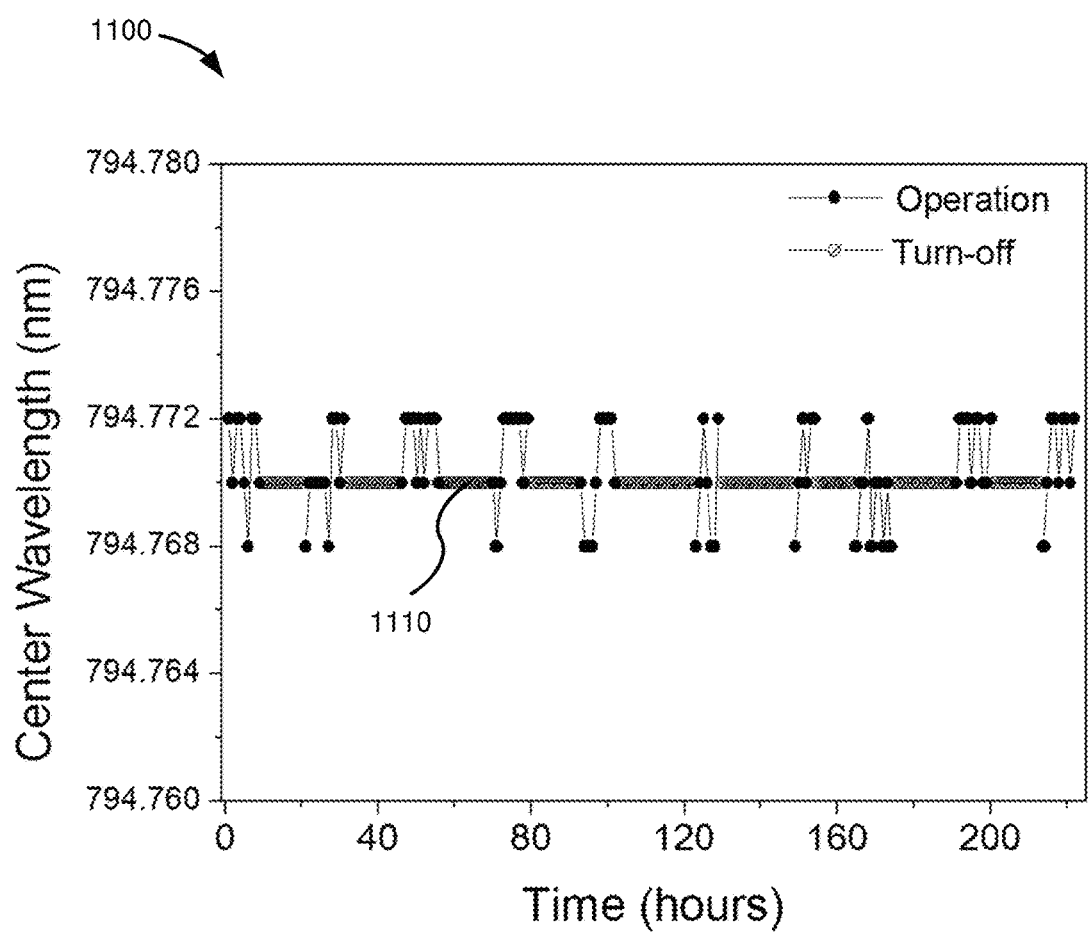
FIG. 11 is a graph illustrating the long-term stability of the spectrum in an example implementation of the configuration shown in FIG. 5.

As noted above, embodiments of the disclosed system exhibit highly stable behavior. FIG. 11 is a graph 1100 illustrating the long term stability of the spectrum. In particular, the spectrum of the laser system was measured every hour during a 220 hour test. The laser system was turned off every evening and was turned back on every morning. The first data point was taken after the laser system had run for one hour. The center wavelength drifting of the laser diode was ~±0.002 nm during this long term stability testing. There are several factors that likely caused the center wavelength fluctuation: (a) the fluctuation of the laser diode current; (b) the fluctuation of the laser diode temperature; (c) the fluctuation of the VHG (VBG) temperature; and/or (d) the misalignment of the external cavity and the cavity length due to alignment change with the temperature change.

The current fluctuation was less than ±0.1 A based on the display of the current driver. The drifting rate of the locked center wavelength was around 0.01 nm/A. The center wavelength drift due to current fluctuation was less than ±0.001 nm. Since the temperature of the example water chiller fluctuated ±0.05 K around the set temperature, the water-cooled laser diodes of the example implementation had a temperature fluctuation around this range. Within the VHG (VBG) locking range, the center wavelength fluctuation had a temperature dependence of 0.02 nm/K. The center wavelength of the laser varied ±0.001 nm due to the temperature fluctuation of the cooling water. The temperature of VHG holder was stabilized by a TE controller and the temperature fluctuation of the VHG (VBG) holder is limited to be ±0.005 K. The temperature tuning rate of the VHG (VBG) was measured to be 0.0075 nm/K. Thus, the wavelength drifting due to the change of VHG (VBG) temperature was estimated to be so little that it could be neglected. The total center wavelength drift was estimated to be around ±0.002 nm. A more stable water chiller with a larger water reservoir can be used in other embodiments to help reduce the diode temperature fluctuation.

Figure 12:
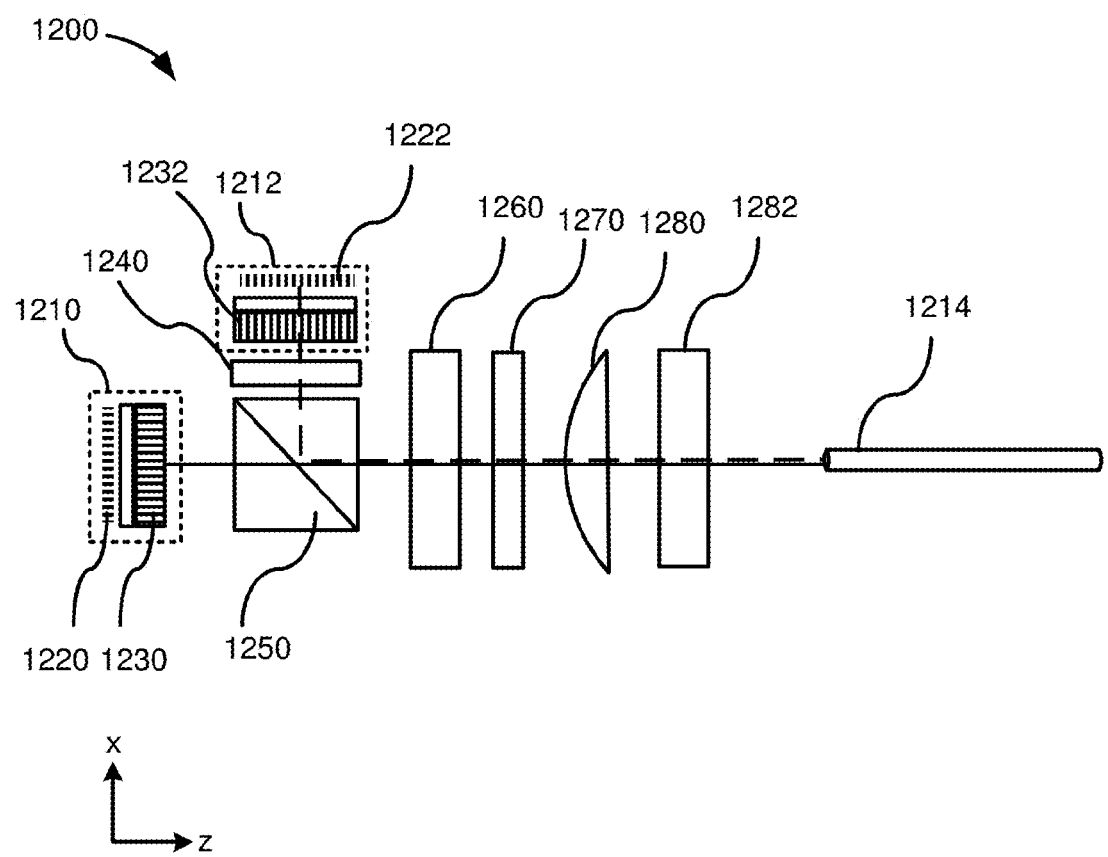
FIG. 12 is a schematic block diagram showing a configuration comprising multiple laser sources.

In further embodiments of the disclosed technology, the laser system power is scaled up by combining multiple laser sources. FIG. 12 is a schematic diagram 1200 of one such example configuration. In particular, schematic diagram 1200 shows a top view of a multiple laser source system comprising two laser source modules (shown as modules 1210, 1212, respectively) with one multi-mode fiber delivery (shown as fiber 1214). Referring to FIG. 12, the first module 1210 comprises a first LDA 1220 (e.g., a 1×n laser diode array) and a first beam twister 1230 (e.g., a beam twister formed from a fast-axis collimating lens and an array of 45° tilted cylindrical lenses), and the second module 1212 comprises a second LDA 1222 (e.g., a 1×n laser diode array) and a second beam twister 1232. The configuration of FIG. 12 further comprises half-wave plate 1240 (configured to shift the polarization of the received beamlets from the laser module 1212), a polarized beam splitter 1250 (configured to receive the separate beams and combine them), collimating lens 1260 (implemented by a cylindrical lens), VHG (VBG) 1270 (e.g., a VHG (VBG) having a center resonant wavelength 794.77 nm and a spectral bandwidth 0.13 nm), and two or more focusing lenses 1280, 1282 (implemented as a first cylindrical lens oriented along the fast-axis and a second cylindrical lens oriented along the slow-axis). By combining beams in this manner, the laser power can be scaled up to a desired power level.

Figure 15:
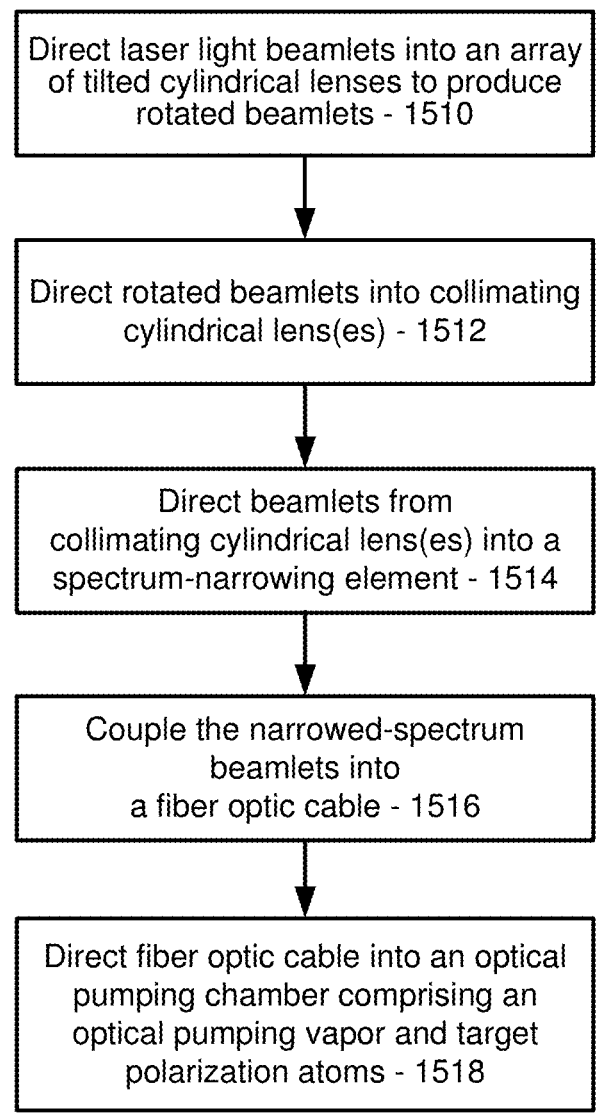
FIG. 15 is a flow chart showing an example method for producing and using a fiber-coupled laser beam in a spin-exchange optical pumping system in accordance with the disclosed technology.

FIG. 15 is a flow chart showing an example method 1500 for producing and using a fiber-coupled laser beam in a spin-exchange optical pumping system. The particular embodiment should not be construed as limiting, as the disclosed method acts can be performed alone, in different orders, or at least partially simultaneously with one another. Further, any of the disclosed methods or method acts can be performed with any other methods or method acts disclosed herein.

At 1510, a series of laser light beamlets is directed into an array of tilted cylindrical lenses that rotate the laser light beamlets and produce rotated laser light beamlets.

At 1512, the rotated laser light beamlets are directed into one or more collimating cylindrical lenses that refract the rotated laser light beamlets and produce laser light beamlets with a smaller divergence angle (e.g., substantially collimated light beamlets).

At 1514, the laser light beamlets from the one or more collimating cylindrical lenses are directed into a spectrum-narrowing element that narrows a spectrum of the laser light beamlets from the one or more collimating cylindrical lenses around a center wavelength and produces spectrum-narrowed laser light beamlets.

At 1516, the spectrum-narrowed laser light beamlets are coupled into an input of a fiber optic cable.

At 1518, an output of the fiber optic cable is directed into an optical pumping chamber comprising an optical pumping vapor and target polarization atoms.

The spectrum-narrowing element of this embodiment also has an acceptance face with a specified acceptance angle, which is generally small (e.g., 10 mrad or less, such as 5 mrad or less). In particular embodiments, the divergence angle of the light beamlets from the one or more collimating cylindrical lenses is configured to match or substantially match the specified acceptance angle of the spectrum-narrowing element. To achieve this, the divergence angle of the light beamlets emanating from the one or more cylindrical lenses is adjusted until it satisfies a threshold ratio relative to the specified acceptance angle of the spectrum-narrowing element. On account of the small acceptance angle of the spectrum-narrowing element (e.g., 10 mrad or less), even divergence angles that produce ratios of 4:1 (or lower) or 2:1 (or lower) are relatively close to the acceptance angle and may be considered as substantially matching the acceptance angle.

The adjusting can be performed by altering a distance between the one or more collimating cylindrical lenses and the array of tilted cylindrical lenses. In further implementations, the divergence angle of the light beamlets emanating from the one or more from the collimating cylindrical lenses is adjusted until sidebands in the spectrum-narrowed beamlets emanating from the spectrum-narrowing element are eliminated or substantially eliminated. For example, the divergence angle can be adjusted until the side mode suppression ratio (SMSR) is 15 dB or greater. Additionally, the temperature of the spectrum-narrowing element can be adjusted until the center wavelength matches or substantially matches an absorption linewidth of the optical pumping vapor.

Figure 16:
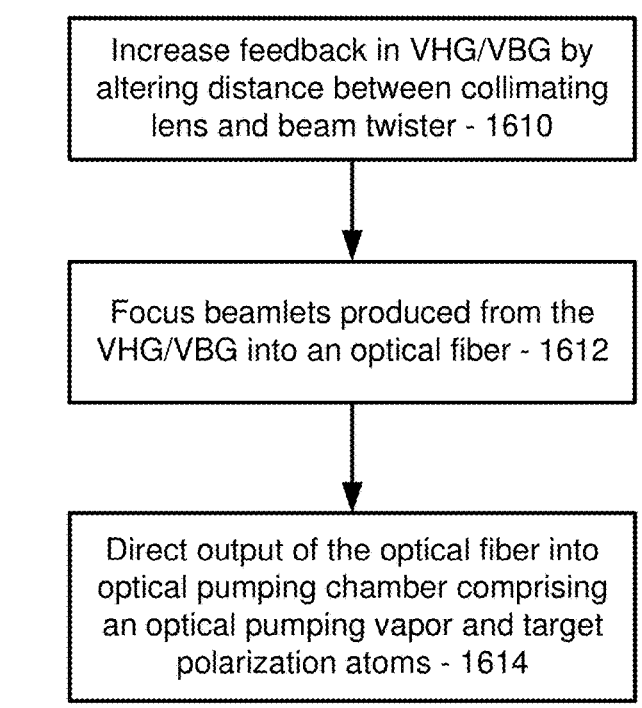
FIG. 16 is a flow chart showing another example method for operating a spin-exchange optical pumping system in accordance with the disclosed technology.

FIG. 16 is a flow chart showing an example method 1600 for operating a laser source for a spin exchange optical pumping system. The particular embodiment should not be construed as limiting, as the disclosed method acts can be performed alone, in different orders, or at least partially simultaneously with one another. Further, any of the disclosed methods or method acts can be performed with any other methods or method acts disclosed herein.

At 1610, feedback between a VHG (VBG) and a laser beam source (e.g., an LDA) is increased by altering a distance between a collimating lens and a beam twister producing rotated beamlets from the laser beam source. For instance, the VHG (VBG) can be positioned after one or more collimating lenses as in FIG. 5 above. In this embodiment, the collimating lens produces substantially collimated beamlets that are incident on an acceptance face of the VHG (VBG).

At 1612, the beamlets produced from the VHG (VBG) are focused into an optical fiber.

At 1614, an output of the optical fiber is directed into an optical pumping chamber comprising an optical pumping vapor and target polarization atoms.

In particular implementations, the VHG (VBG) is positioned after all collimating lenses in the spin exchange optical pumping system. In some implementations, the distance between the collimating lens and the output of the beam twister results in a ratio of 4:1 or less between a divergence angle of the substantially collimated beamlets and an acceptance angle of the VHG (VBG). In other implementations, the distance between the collimating lens and the output of the beam twister results in a ratio of 2:1 or less between a divergence angle of the substantially collimated beamlets and an acceptance angle of the VHG (VBG).

In some implementations, a beam twister is interposed between the collimating lens and the laser beam source. In such implementations, the collimating lens focuses rotated versions of a slow axis of beamlets produced from the laser beam source.

The VHG (VBG) can be an off-the-shelf, non-custom VHG (VBG). Further, the VHG (VBG) can have a relatively small acceptance angle, such as 10 mrad or less, or 5 mrad or less. In some implementations, the optical pumping vapor is rubidium. Further, in certain implementations, the target polarization atoms are one of $^3$He or $^{129}$Xe.

IV. Concluding Remarks

Having illustrated and described the principles of the disclosed technology, it will be apparent to those skilled in the art that the disclosed embodiments can be modified in arrangement and detail without departing from such principles. For example, any one or more aspects of the disclosed technology can be applied in other embodiments. In view of the many possible embodiments to which the principles of the disclosed technologies can be applied, it should be recognized that the illustrated embodiments are only preferred examples of the technology and should not be taken as limiting the scope of the invention.

What is claimed is:

1. A laser system for spin exchange optical pumping, comprising:

a laser source comprising an array of laser diodes;
a beam twister positioned to receive individual beamlets from the array of laser diodes, the beam twister being configured to rotate the individual beamlets from the array of laser diodes and produce rotated beamlets;
one or more collimating lenses positioned to receive the rotated beamlets produced by the beam twister and produce substantially collimated beamlets having a divergence angle;
a spectral-line-width-reducing element positioned to receive the substantially collimated beamlets from the one or more collimating lens and produce spectral-line-width-reduced beamlets;
an optical fiber; and
one or more focusing lenses positioned between the optical fiber and the spectral-line-width-reducing element and configured to receive the spectral-line-width-reduced beamlets and focus the spectral-line-width-reduced beamlets into the optical fiber;
wherein the laser source, beam twister, collimating lenses, and spectral-line-width-reducing element are configured such that a side-mode suppression ratio of at least 15 dB is obtained for the spectral-line-width-reduced beamlets.

2. The laser system of claim 1, wherein the spectral-line-width-reducing element has an acceptance angle, and wherein a distance between the one or more collimating lenses and the beam twister is selected such that a ratio of the acceptance angle of the spectral-line-width-reducing element to the divergence angle of the substantially collimated beamlets is 4:1 or less.

3. The laser system of claim 2, wherein the first ratio is in the range 2:1 to 1:1.

4. The laser system of claim 1, wherein the spectral-line-width-reducing element is a volume holographic grating (VHG) or a volume Bragg grating (VBG).

5. The laser system of claim 1, wherein no collimating lens is positioned after the spectral-line-width-reducing element along a beam path of the system.

6. The laser system of claim 1, wherein the beam twister causes a slow axis of the individual beamlets from the array of laser diodes to rotate 90 degrees and become oriented along a fast axis of the array of laser diodes, and wherein the one or more collimating lenses are one or more cylindrical lenses configured to reduce the divergence of the slow axis of the rotated beamlets produced by the beam twister.

7. The laser system of claim 6, wherein the beam twister includes a beam-twister collimating lens configured to collimate a fast axis of the individual beamlets prior to rotating the individual beamlets.

8. The laser system of claim 1, wherein the one or more focusing lenses comprises a slow-axis focusing lens and a fast-axis focusing lens.

9. The laser system of claim 1, further comprising a chamber housing an alkali metal vapor, the optical fiber being configured to deliver the spectral-line-width-reduced beam to the chamber.

10. The laser system of claim 9, wherein the alkali metal vapor is rubidium.

11. The laser system of claim 9, wherein the chamber housing the alkali metal vapor is configured to polarize one of $^3$He or $^{129}$Xe.

12. The laser system of claim 1, wherein the laser source is a first laser source, the array of laser diodes is a first array of laser diodes, the beam twister is a first beam twister, and the rotated beamlets are first rotated beamlets, and wherein the laser system further comprises:

a second laser source comprising a second array of laser diodes;
a second beam twister positioned to receive individual beamlets from the second array of laser diodes, the beam twister being configured to rotate the individual beamlets from the second array of laser diodes and produce second rotated beamlets;
a half-wave plate positioned to receive the second rotated beamlets and produce a polarization-shifted version of the second rotated beamlets; and
a polarizing beam splitter positioned to receive the polarization-shifted version of the second rotated beamlets and the first rotated beamlets and produce a combined set of rotated beamlets that is directed at the one or more collimating lenses.

13. A method, comprising:
directing a series of laser light beamlets into an array of tilted cylindrical lenses that rotate the laser light beamlets and produce rotated laser light beamlets;
directing the rotated laser light beamlets into one or more cylindrical lenses that refract the rotated laser light beamlets and produce laser light beamlets with a smaller divergence angle;
directing the laser light beamlets from the one or more cylindrical lenses into a spectrum-narrowing element that narrows a spectrum of the laser light beamlets from the one or more cylindrical lenses around a center wavelength and produces spectrum-narrowed laser light beamlets, the spectrum-narrowing element further having an acceptance face with a specified acceptance angle; and
coupling the spectrum-narrowed laser light beamlets into an input of a fiber optic cable;
wherein a ratio of the smaller divergence angle to the specified acceptance angle is adjusted to provide a side-mode suppression ratio of at least 15 dB for the spectrum-narrowed laser light beamlets.

14. The method of claim 13, wherein the divergence angle of the laser light beamlets from the one or more cylindrical lenses matches or substantially matches the specified acceptance angle of the spectrum-narrowing element.

15. The method of claim 13, further comprising, adjusting the divergence angle of the laser light beamlets emanating from the one or more cylindrical lenses until it has a ratio of 2:1 or less relative to the specified acceptance angle of the spectrum-narrowing element.

16. The method of claim 13, further comprising, adjusting the divergence angle of the laser light beamlets emanating from the one or more cylindrical lenses until sidebands in the spectrum-narrowed laser light beamlets emanating from the spectrum-narrowing element are eliminated or substantially eliminated.

17. The method of claim 16, wherein the adjusting the divergence angle is performed by altering a distance between the one or more cylindrical lenses and the array of tilted cylindrical lenses.

18. The method of claim 13, further comprising, adjusting a temperature of the spectrum-narrowing element until the center wavelength matches or substantially matches an absorption line of an optical pumping vapor.

19. The method of claim 13, further comprising, directing an output of the fiber optic cable into an optical pumping chamber comprising an optical pumping vapor and target polarization atoms.

20. A method, comprising:
in a laser source for a spin exchange optical pumping system, increasing feedback between a volume holographic grating (VHG) or a volume Bragg grating (VBG) and a laser beam source by altering a distance between a collimating lens and a beam twister rotating beamlets from the laser beam source, wherein the collimating lens produces substantially collimated beamlets that are incident on an acceptance face of the VHG or the VBG, so that a side mode suppression ratio (SMSR) in the range 15 dB to 30 dB is obtained;

focusing the beamlets produced from the VHG or VBG into an optical fiber; and directing an output of the optical fiber into an optical pumping chamber comprising an optical pumping vapor and target polarization atoms.

21. The method of claim 20, wherein the VHG or VBG is positioned after all collimating lenses in the spin exchange optical pumping system.

22. The method of claim 20, wherein the distance between the collimating lens and the beam twister results in a ratio of 4:1 or less between a divergence angle of the substantially collimated beamlets and an acceptance angle of the VHG or VBG.

23. The method of claim 20, wherein the distance between the collimating lens and the beam twister results in a ratio of 2:1 or less between a divergence angle of the substantially collimated beamlets and an acceptance angle of the VHG or VBG.

24. The method of claim 20, wherein the beam twister is interposed between the collimating lens and the laser beam source.

25. The method of claim 24, wherein the collimating lens collimates rotated versions of a slow axis of beamlets produced from the laser beam source.

26. The method of claim 20, wherein the VHG or VBG is a non-custom VHG or VBG.

27. The method of claim 20, wherein the VHG or VBG has an acceptance angle of 10 mrad or less.

28. The method of claim 20, wherein the optical pumping vapor is rubidium.

29. The method of claim 20, wherein the target polarization atoms are one of $^3$He or $^{129}$Xe.

30. The method of claim 13, wherein the ratio of the smaller divergence angle to the specified acceptance angle is in a range of 1:1 to 4:1.

* * * * *